United States Patent [19]

Fletcher et al.

[11] 3,840,829

[45] Oct. 8, 1974

[54] INTEGRATED P-CHANNEL MOS GYRATOR

[76] Inventors: James C. Fletcher, Administrator of the National Aeronautics and Space Administration with respect to an invention of; Erwin S. Hochmair, Barnabitengasse 10/18, A-1060, Vienna, Austria

[22] Filed: Feb. 2, 1973

[21] Appl. No.: 329,237

[52] U.S. Cl. ............... 333/80 T, 307/295, 307/304, 307/18, 307/35

[51] Int. Cl. ........................ H03h 7/44, H03h 11/00

[58] Field of Search ................ 330/18, 35, 71, 151; 307/205, 221, 251, 279, 304; 333/80 T

[56] References Cited

UNITED STATES PATENTS

| | | | |
|---|---|---|---|
| 3,492,602 | 1/1970 | Berwin | 330/151 |
| 3,626,304 | 12/1971 | Wallen | 328/133 |
| 3,728,556 | 4/1973 | Arnell | 307/304 |
| 3,729,693 | 4/1973 | Dolby | 330/151 |

*Primary Examiner*—John Zazworsky
*Attorney, Agent, or Firm*—George J. Porter; L. D. Wofford, Jr.; John R. Manning

[57] ABSTRACT

A gyrator circuit of the conventional configuration of two amplifiers in a circular loop, one producing zero phase shift and the other producing 180° phase reversal, in a circuit having medium Q composed of all field effect transistors of the same conductivity type. The current source to each gyrator amplifier comprises an amplifier which responds to changes in current, with the amplified signals fed back so as to limit current. The feedback amplifier has a large capacitor connected to bypass high frequency components and thereby stabilize the output. The design makes possible fabrication of circuits with transistors of only one conductivity type, providing economies in manufacture and use.

8 Claims, 3 Drawing Figures

INTEGRATED P-CHANNEL MOS GYRATOR

ORIGIN OF THE INVENTION

The invention described herein was made in the performance of work under a NASA contract and is subject to the provisions of Section 305 of the National Aeronautics and Space Act of 1958, Public Law 85-568 (72 Stat. 435; 42 U.S.C. 2457).

BACKGROUND OF THE INVENTION

This invention relates to gyrator circuits and, more specifically, to such circuits comprising field effect transistors of a single conductivity type, which design is particularly useful for integrated circuits.

Gyrator circuits are circuits which reverse or invert the apparent effect of circuit elements and thereby produce one impedance while actually employing an element having the opposite impedance. Gyrators are now of great importance to produce inductance from capacitors rather than coils in integrated circuits, printed circuits, and the like since coils or similar elements are not readily produced in such circuitry and, in fact, are quite impractical in some instances.

Gyrator technology is at present somewhat active, and includes various circuits employing voltage controlled current sources and circuits employing only field effect transistors (FETs) as the active elements. With the exception of the early designs and one recent design, all of which have unsatisfactorily low Q, practically all gyrators use a complementary design, which means they employ transistors of both polarities (pnp and npn transistors or, if field effect transistors, p-channel and n-channel) in the same circuit. With such circuit designs, Q factors greater than 50 are obtained.

The inventor of this application has previously been the inventor in a United States patent application titled Gyrator Employing Field Effect Transistors, filed 1972, now U.S. Pat. No. 3,715,693, which provides a very high Q using only FETs, based upon the voltage controlled current source design (VCCS) of two VCCS circuits, one inverting and one non-inverting, which is the same underlying design upon which the instant invention is based. But that previous invention does employ complementary transistors in the design.

Because of their extremely high input resistance ($10^{11}$ ohms), metal oxide semiconductor field effect transistors (MOS FETs) are well suited to VCCS gyrator circuits. But their output resistance varies inversely with drain current and their gain varies inversely with the square root of drain current. MOS FETs are especially useful for low power gyrators featuring high gyration resistance, but, to prevent reduction of the voltage gain and the output resistance, the drain current must be limited. Typically, drain current is supplied by a current source, which in a conventional design was a transistor of opposite polarity or conductivity type, thus embodying a complementary design.

Accordingly, prior gyrators are not readily available in integrated form since no satisfactory design using transistors of one conductivity type or polarity is known. Processes of production to make circuits with complementary FETs or bipolar transistors are significantly more expensive.

SUMMARY OF THE INVENTION

It is a primary object of this invention to provide an economically fabricated transistor gyrator circuit having a Q (quality factor) of approximately 100.

It is another primary object of this invention to provide a gyrator circuit having moderately high Q employing transistors of only one polarity.

Similarly, it is an object of this invention to provide a gyrator circuit which can be readily and economically manufactured as an integrated circuit.

It is another, more specific object of this invention to provide a gyrator circuit which can be manufactured by the potentially inexpensive p-channel metal oxide semiconductor process.

Several gyrators in accordance with this invention could be integrated into one chip, which could be of advantage in filter design, where usually more gyrators are necessary for one filter. Furthermore, the gyrator could be integrated with other MOS circuits of the same conductivity type, thus eliminating external connections and enhancing reliability.

Although p-channel circuits are mentioned because of the inexpensive processes available, the design is not at all limited to p-channel, as an all n-channel circuit would perform essentially identically.

Because the voltage gain of an FET amplifier does not degrade with decreasing supply current, operation at low power levels is possible.

In accordance with this invention, the basic gyrator design comprises two, essentially similar FET gyrator amplifiers, one connected to the other with phase inversion and the other connected to the first without phase change. Current to each amplifier is by a source associated with it in which changes in current are sensed, amplified, and fed back to a control element of a transistor in the source in a manner to limit changes in current. In the preferred embodiment the feedback amplifier of the current source contains a relatively large impedance connected to stabilize the response at different frequencies.

Other objects, features, advantages, and characteristics of the invention will be apparent from the following description of preferred embodiments, as illustrated from the accompanying drawings.

DESCRIPTION OF THE PREFERRED EMBODIMENTS

Figure 1:
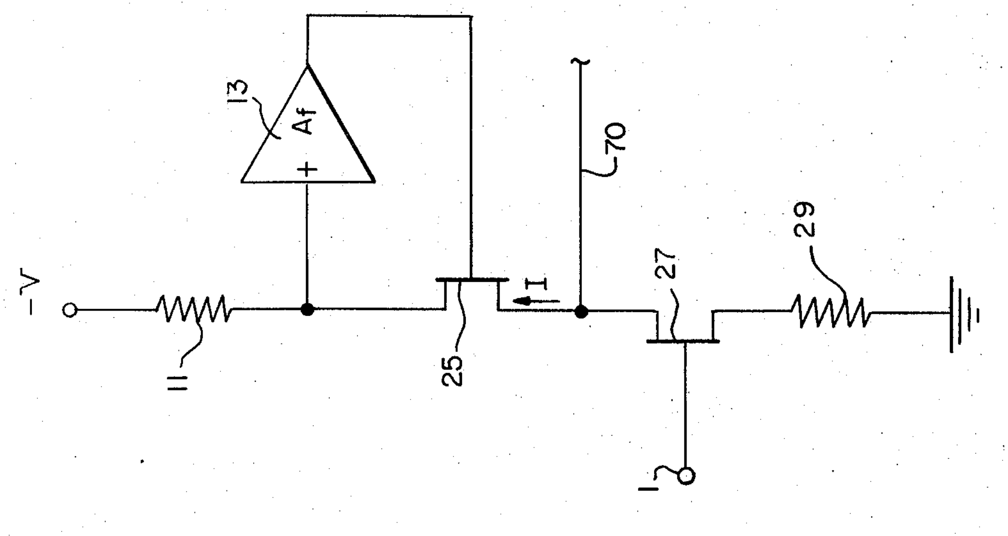
FIG. 1 is an illustrative description of the general aspects of the preferred current source and the gyrator amplifier associated with it.

Reference is made to FIG. 1, which is illustrative of the general aspects of the preferred circuit to provide limited current to the gyrator amplifier by amplification and feedback at the source of current. In FIG. 1 a source of constant potential, —V, is connected to a resistor 11 and the other side of resistor 11 is connected to the input of an amplifier 13.

Resistor 11 at the point of connection to amplifier 13 is also connected to the drain of a p-channel metal oxide semiconductor field effect transistor 25.

Field effect transistors may be perfectly symmetrical and reciprocal between source and drain. The source and drain terminals, however, usually may still be identified conceptually, and, accordingly, the terminals generally are so identified in the terminology used herein. The gate element is a control input to the field effect transistor and functions with the source to control signals passed between the source and the drain. The conductivity type of the transistor refers to the conductivity characteristics, whether the conventional N or P, of the source-to-drain channel of the transistor, and the main body of the transistor is of the opposite conductivity type.

All of the transistors of the circuits of the preferred embodiments are of the same kind and conductivity type, providing basic advantages in manufacturing and use, as discussed elsewhere. Since they are essentially similar, each of the transistors in the preferred embodiments will be referred to in the following discussion simply as FETs.

Figure 2:
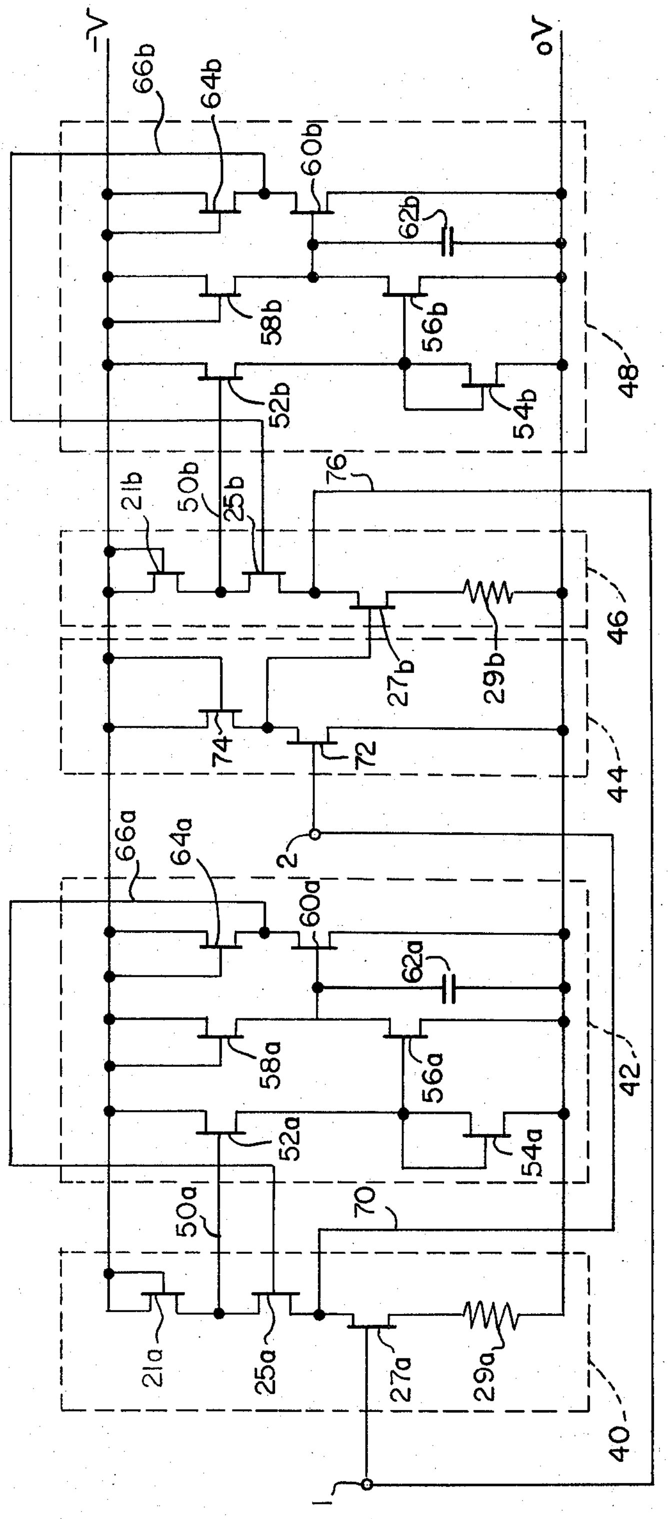
FIG. 2 is a circuit diagram of the preferred gyrator.

The source of FET 25 is connected to the drain of FET 27. As will be clear when FIG. 2 is discussed, FET 27 is an amplifying element in a gyrator amplifier associated with the current source which includes FET 25. The gate of FET 27 is connected to terminal 1. The source of FET 27 is connected to resistor 29, which is connected to ground.

In the operation of the circuit of FIG. 1, an input signal at terminal 1 changes the current flowing through the source and drain of FET 27. Changes in current appear across resistor 11, are amplified by amplifier 13 and are fed back to the gate of FET 25 in an effective sense opposite to that of the changes in current. By this mode of operation, changes in source-to-drain current through FET 27 are greatly limited, and the amplification across FET 27 is kept high.

With respect to the overall gyrator design, the preferred embodiment of which is shown in FIG. 2, the basic design employs the voltage controlled current source (VCCS) concept of two amplifiers, one inverting and one non-inverting, connected in a negative feedback loop. Such a basic design is a conventional one for gyrators, and an improved design employing field effect transistors is described in my United States patent application titled Gyrator Employing Field Effect Transistors, Ser. No. 236,281, filed Mar. 20, 1972, now U.S. Pat. No. 3,715,693. That design, however, employs transistors of complementary conductivity, a disadvantage avoided in the instant design.

The input and output resistance are designed to be sufficiently high so that the circuit is essentially responsive to voltage and not current at the input. Because of their extremely high input resistance ($10^{11}$ ohms), metal oxide semiconductor FETs are well suited to such circuits. The output resistance, $R_o$, of such a transistor is comparable to the output resistance of bipolar transistors, and it varies approximately inversely with the drain current, $I_D$, which reinforces the desirability of the design criterion of limiting drain current.

Limitation of current across MOS FETs also produces high gain. The transconductance, $g_m$, of the FETs is proportional to the square root of the drain current, $I_D$. Accordingly, the factor of amplification is proportional to the reciprocal of the square root of $I_D$, and high amplification is obtained by limiting $I_D$.

As previously indicated, in prior designs $I_D$ is typically limited by providing a source of current to the gyrator amplifier employing transistors (which may be pnp or npn, or FET type, depending upon the specific circuit) of complementary design, that is, transistors of both polarities in the same circuit. It is a basic objective of this circuit that such complementary design is avoided.

In FIG. 2, the resistor 11 in FIG. 1 is seen to be implemented by an FET 21 connected as a diode. The portion in dotted outline 40 is the gyrator amplifier of the inverting VCCS with its associated current source, and the portion in dotted outline 42 is the current source feedback amplifier for 40. Dotted outline 44 indicates an inverter preceding the non-inverting VCCS. The portion in outline 46 is the gyrator amplifier and its associated current source of the non-inverting VCCS having input terminal two, and portion 48 is the current source feedback amplifier for 46.

The circuit is reciprocal, and the input signal may drive either the amplifier with phase reversal or the one without. Connection of an electrical element of a given kind at the terminal 1 or 2 in FIG. 2 causes the reciprocal element to effectively appear at the other terminal 1 or 2. For example, a conventional capacitor connected to terminal 2 results in an inductance appearing at terminal 1.

Because of their largely identical arrangement and function, the individual elements of the two amplifiers will be given the same numeral, followed by the letter *a* for elements associated with the inverting amplifier and *b* for corresponding elements associated with the non-inverting amplifier. In discussing the elements in a context which applies to either, the letters will not be specified. It should be understood that the discussions herein with regard to FIGS. 1 and 3 apply in all basic respects to both VCCSs of the gyrator of the preferred embodiment.

Connection from the junction of FETs 21 and 25 is by line 50 to the gate of FET 52, the drain of which is connected directly to −V. The source of FET 52 is connected to diode-connected FET 54. The junction of FETs 52 and 54 is connected to the gate of FET 56. The source of FET 56 is connected to O V, and the drain is connected to diode-connected FET 58. The junction of FETs 56 and 58 is connected to the gate of FET 60 and is also connected to a capacitor 62, of relatively large capacitance, the other side of which is connected to O V. The source of FET 60 is connected to O V, and the drain is connected to diode-connected FET 64. Line 66 is connected to the junction of FETs 60 and 64, and to the gate of FET 25.

The output of the inverting gyrator amplifier is connected on line 70 from the junction of FETs **25*a* and 27*a* to terminal 2. Terminal 2 connects directly to the gate of FET 72, the source of which is connected to O V, and the drain of which is connected to diode-connected FET 74. The junction of FETs 72 and 74 is connected to the gate of FET 27*b*.**

The output of the non-inverting gyrator amplifier is connected on line 76 directly to the gate of FET **27*a*.**

In operation the gyrator amplification with current limiting to the gyrator amplifiers is as discussed in connection with FIG. 1. FETs 72 and 74 comprise an inverter, and the two, interconnected VCCSs function together as a conventional gyrator of similar underlying design.

Amplification of the current limiting feedback signal is by line 50 to FET 52, which operates in a source follower mode. The signal is further amplified and inverted by FETs 56 and 60, and fed back on line 66. Capacitor 62 provides a bypass path to O V of high frequency components, thereby stabilizing the response of the amplifier against changes in frequency.

In a preferred form all of the transistors of the embodiment of FIG. 2 are p-channel MOS FETs. The p-channel production processes are at present potentially advantageous economically.

Figure 3:
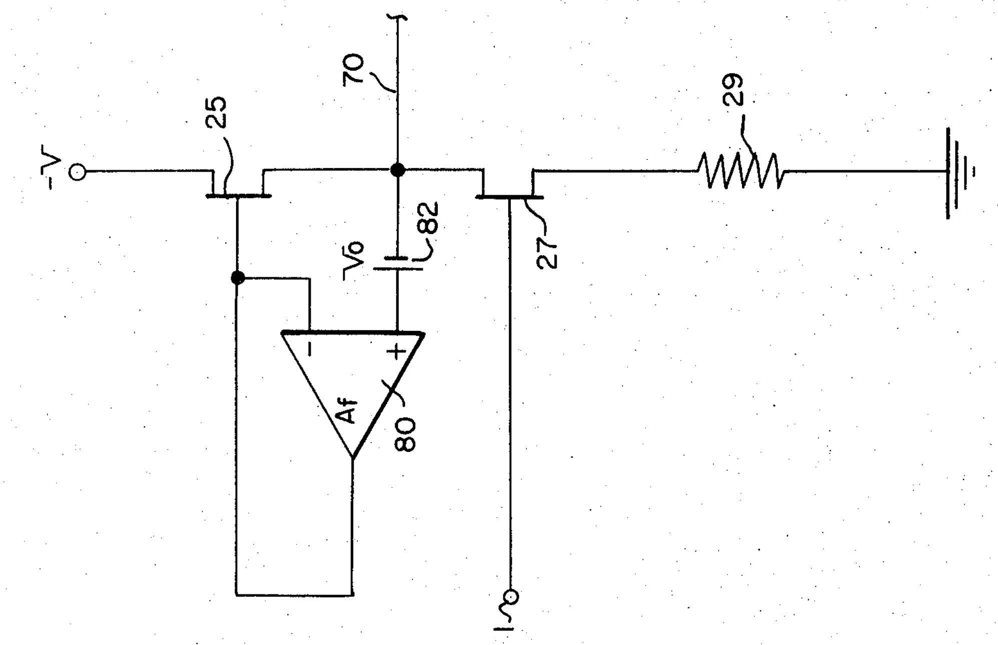
FIG. 3 is an illustrative description of the general aspects of an alternative current source and the gyrator amplifier associated with it.

FIG. 3 illustrates a possible alternative embodiment, which is somewhat more complicated. Whereas the current limiting feedback of the other embodiment was negative, that of the embodiment of FIG. 3 is positive (falling under the general description of "bootstrapping"").

In this embodiment the gate of FET 25 is connected to one of the inputs of a differential amplifier 80, and the gate is also connected to the output of the amplifier 80. The other input of amplifier 80 is connected to a dc voltage source 82, $V_o$, the other side of which is connected to the junction of FETs 25 and 27. ($V_o$ 82 is an offset voltage which determines the general or nominal dc current. In actual practice it may be replaced by a diode-connected FET.) As in the FIG. 1 embodiment, FET 27 is connected through resistor 29 to ground.

The output conductance of the current source is simply the transconductance of FET 25, $g_m$, divided by the gain of amplifier 80. Accordingly, drain current across FET 27 is greatly limited, as desired.

THEORETICAL CONSIDERATIONS

With respect to FIG. 1, the small ac current I, which flows in the current source, develops a voltage which is fed back to FET 25 to produce an effectively high impedance, Z. By conventional circuit analysis:

$$Z = 1/g_{25} + 1/[1/A_{fo}R_{11}] + [jW(T/A_{fo}R_{11})]$$

Where:

$g_{25}$ is the transconductance of FET 25;

$A_{fo}$ is the low frequency amplification of amplifier 13;

W is angular velocity in radians per second; and

T is the time constant given by the value of the capacitor 62 (FIG. 2) times the resistance (approximately 100K ohms) of the node to which capacitor 62 is connected.

A one polarity response is assumed, which is justified by the stabilization provided by the capacitor 62.

Only the real part of Z is an influence on the quality of the gyrator. In order not to unduly degrade the performance of the gyrator, Z should be larger than the output resistance, $R_o$, of the associated gyrator amplifier comprising FET 27 and $R_{29}$. This is indeed the case in this design for resistors 29 of up to 3K ohms. For example, for $R_{29}$ = 2K ohms, Z = 300K ohms and $R_o$ = 230K ohms.

The output resistance of the basic gyrator amplifier is:

$$R_o = 1 + g_m R_{29}/G_o$$

Where:

$g_m$ is the transconductance of FET 27; and $G_o$ is the reciprocal of the output resistance of FET 27 without emitter degeneration.

Similarly, the transconductance of the gyrator amplifier is:

$$g_{gyr} = g_m/1 + g_m R_{29}$$

Except for the additional inverter comprising FETs 72 and 74, the non-inverting VCCs is identical to the inverting VCCS. The inverter comprising FETs 72 and 74 is not stabilized by circuit connections, but rather utilizes the inherent stability of the voltage gain in p-channel MOS amplifiers, which to a first approximation depends on the relative geometries of the FETs 72 and 74 only.

In an experimental integrated circuit the voltage gain, $A_I$, of this inverter was 3.

The transconductance of the non-inverting VCCS is:

$$g_{gyr}\ (\text{non-inv.}) = A_I g_m/1 + R_{29b} g_m$$

The quality factor, Q, of the gyrator is given by:

$$Q = \frac{A_I}{2} \cdot \frac{g_m}{G_0} \cdot \frac{1}{\left(\left(1+\frac{1+g_m R_{29b}}{A_{f0} R_{11} G_0}\right) \cdot \left(1+\frac{1+A_I g_m R_{29a}}{A_{f0} R_{11} G_0}\right)\right)^{+1/2}}$$

Measured Q values are given in the following table for two values of supply voltage, $V_S$, and several values of the gyration resistors $R_{29}$.

| $V_S$ (volts) | Q | | | |
|---|---|---|---|---|
| 23 | 110 | 95 | 80 | 35 |
| 28 | 70 | 60 | 48 | 28 |
| $R_{29}$ (ohms) | 0 | 600 | 2K | 10K |

The measured results are within 20 percent of the theoretical values obtained by the preceding equation. Power consumption was 13.8 mW at $V_S$ of 23 volts and 56 mW at $V_S$ of 28 volts. The maximum ac voltage at the ports is 1.5 volts and the efficiency is about 1 percent. Q enhancement begins to take effect at a frequency of approximately 1 KHz, but the circuit is usable up to several KHz with appropriate phase correction.

CONCLUSION

Other variations of the invention described will be apparent, and variations may well be developed which employ more than ordinary skill in this art, but nevertheless employ the basic contribution and elements of this invention. Accordingly, patent protection should not be essentially limited by the preferred embodiment disclosed, but should be as provided by law with particular reference to the accompanying claims.

What is claimed is:

1. A gyrator circuit comprising a first and a second gyrator amplifier, each comprising a first field effect transistor to amplify signals, the output of each said first and second gyrator amplifier being connected to the input of the other, one of the output signals of one of the amplifiers connected to the input of the other to apply signals phase reversed from the output signals of the one and the other connected to the input of the one to apply signals of the same phase as the output signals of the other, each said gyrator amplifier having connected as the source of current to it a circuit comprising an additional field effect transistor connected source-to-drain to the drain of said field effect transistor of its associated gyrator amplifier, means to sense changes in current to the associated gyrator amplifier, means to amplify said observed changes, and means to return said amplified signals to the gate of said additional transistor so as to limit said changes in current to relatively small changes when the changes in voltage input to the associated gyrator amplifier are relatively large.

2. The circuit as in claim 1 in which all transistors in said circuit are field effect transistors of the same conductivity type.

3. The circuit as in claim 1 in which at least one of said means to amplify said observed changes is connected to a relatively large impedance effective to stabilize the signals amplified against changes with frequency.

4. The circuit as in claim 2 in which at least one of said circuits connected as a source of current comprises a resistance element to sense said changes in current with said additional field effect transistor connected between said resistance element and the source-to-drain circuit of the field effect transistor of the associated gyrator amplifier, and also comprises an amplifier with the input connected to the junction of said resistance element and said additional transistor and the output connected to the gate of said additional transistor.

5. The circuit as in claim 2 in which at least one of said circuits connected as a source of current comprises said additional field effect transistor with the source connected to the source-to-drain circuit of the field effect transistor of the associated gyrator amplifier and a differential amplifier with one input connected to the gate of said additional transistor and the other input connected to the source of said additional transistor, the output of said differential amplifier also being connected to the gate of said additional transistor.

6. The circuit as in claim 5 in which the input circuit to said differential amplifier contains a source of reference potential to thereby control the nominal level of current through said additional field effect transistor.

7. The circuit as in claim 4 in which said signals sensed from said resistance element are connected to the gate of one field effect transistor, the output of said one field effect transistor is connected to the gate of a second field effect transistor, and the output of said second field effect transistor is connected across a relatively large capacitor to a source of reference potential and is connected to the gate of a third field effect transistor, and in which said third field effect transistor is connected to the gate of said additional field effect transistor.

8. The circuit as in claim 7 in which all transistors in said circuit are p-channel metal oxide semiconductor field effect transistors.

* * * * *